United States Patent [19]
Carney et al.

[11] Patent Number: 5,319,242
[45] Date of Patent: Jun. 7, 1994

[54] SEMICONDUCTOR PACKAGE HAVING AN EXPOSED DIE SURFACE

[75] Inventors: Francis J. Carney, Gilbert; Edward M. Majors, Tempe; James H. Knapp, Chandler, all of Ariz.

[73] Assignee: Motorola, Inc., Schaumburg, Ill.

[21] Appl. No.: 853,217

[22] Filed: Mar. 18, 1992

[51] Int. Cl.5 .................... H01L 23/48; H01L 29/44; H01L 23/02; H01L 29/40
[52] U.S. Cl. .................... 257/680; 257/673; 257/675; 257/692; 257/704; 257/735; 257/737; 257/774; 257/782
[58] Field of Search .................... 357/70, 72; 257/673, 257/680, 692, 704, 735, 737, 774, 782, 675

[56] References Cited

U.S. PATENT DOCUMENTS

| | | | |
|---|---|---|---|
| 5,001,545 | 3/1991 | Kalfus et al. | 357/70 |
| 5,036,379 | 7/1991 | Smith et al. | 357/69 |
| 5,070,390 | 12/1991 | Shimizu | 357/70 |
| 5,173,764 | 12/1992 | Higgins, III | 257/669 |
| 5,177,669 | 1/1993 | Juskey et al. | 257/675 |

FOREIGN PATENT DOCUMENTS 0002282 8/1977 Japan .
0074951 6/1981 Japan .
0310141 12/1988 Japan .
0011636 1/1991 Japan .

OTHER PUBLICATIONS

IBM Corp., "Tab Tape Structure for Area Array Tab", IBM Technical Disclosure Bulletin, vol. 32, No. 2, Jul 1989.

Primary Examiner—Sara W. Crane
Assistant Examiner—Valencia M. Wallace
Attorney, Agent, or Firm—Harry A. Wolin

[57] ABSTRACT

A semiconductor package includes a die having a first surface including a plurality of bond pads disposed thereon and a second surface. Inner lead portions of a TAB leadframe are coupled to the bond pads and outer lead portions electrically coupled to the inner lead portions extend therefrom. An encapsulation is disposed on the first surface of the die including the bond pads having the inner lead portions of the TAB leadframe bonded thereto. Encapsulation is also disposed about the sides of the die. The second surface of the die remains exposed. This allows for a relatively thin package having superior thermal dissipation properties.

11 Claims, 1 Drawing Sheet

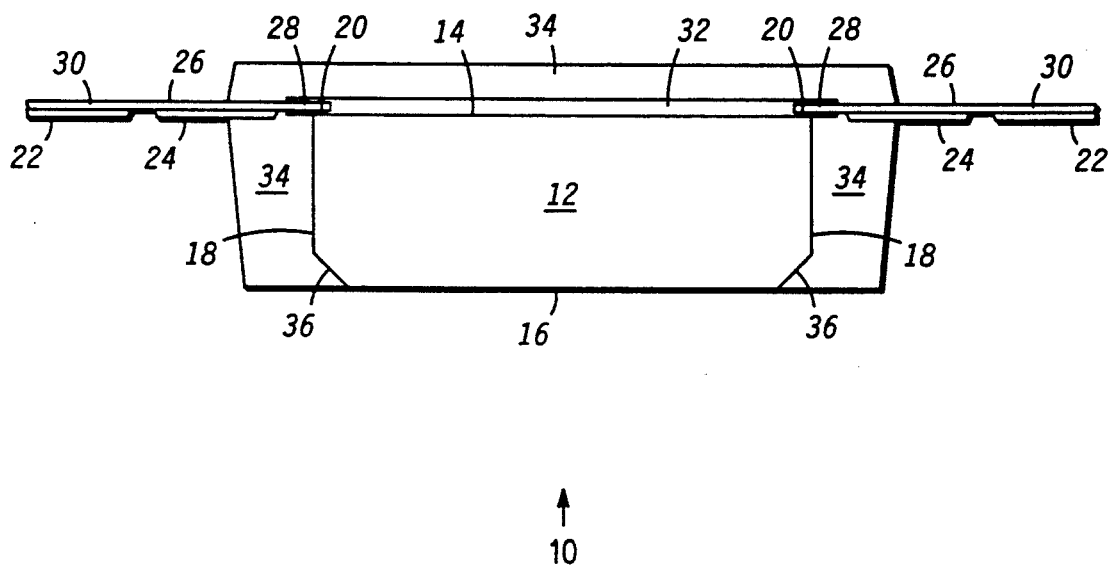

SEMICONDUCTOR PACKAGE HAVING AN EXPOSED DIE SURFACE

FIELD OF THE INVENTION

This invention relates, in general, to the semiconductor arts and more particularly to a semiconductor package having an exposed die surface

BACKGROUND OF THE INVENTION

TAB bonding is well known in the semiconductor arts. A semiconductor die for TAB bonding includes metal bond pads disposed on a surface thereof. A TAB lead tape includes a flexible insulating film such as a polyimide having a metal conductive pattern formed on the insulating material. The metal conductive pattern includes lead portions which are coupled directly to the metal bond pads disposed on the surface of the semiconductor die. In employing TAB bonding, no wire bonding is necessary.

It is also well known in the semiconductor arts to encapsulate semiconductor devices. Encapsulation is typically performed with a polymer, plastic or similar material. The encapsulation most often surrounds the entire semiconductor die. The encapsulation protects the die from moisture and contaminants as well as providing physical protection.

Encapsulating semiconductor devices in plastic and similar materials has various disadvantages. Since the encapsulating material completely encapsulates the semiconductor device, plastic encapsulated packages are often relatively thick. The thickness of these packages includes the sum of the thicknesses of the semiconductor die, the encapsulation disposed on top of the semiconductor die and the encapsulation disposed beneath the semiconductor die. In wire bonded packages, this thickness also includes the height of the wire bonds. In TAB bonded packages where the bond pads are of a significantly lower height than wire bonds, this is not a significant problem.

Encapsulated semiconductor devices generally have poor thermal dissipation properties. When heat is given off by the semiconductor die, it typically must then dissipate through the encapsulation. Well known encapsulation materials do not dissipate heat adequately. The heat dissipation problem is somewhat improved by the addition of heatsinks to encapsulated packages. However, when heatsinks are encapsulated as is well known in the art, the heat must still dissipate through the encapsulation. Packages having an exposed heatsink are also well known in the art. The exposed heatsink dissipates heat adequately in some applications although it is not optimum. A semiconductor die is typically attached to a heatsink using glass filled die attach material. Whenever a semiconductor die is attached to a heatsink, a certain amount of thermal conductivity is lost between the die and the heatsink and thermal dissipation suffers.

Accordingly, it would be highly desirable to have an encapsulated semiconductor package that is relatively thin, has excellent thermal dissipation properties, adequately protects the semiconductor die from moisture and contaminants and is relatively inexpensive to manufacture.

SUMMARY OF THE INVENTION

A semiconductor package comprises a semiconductor die having a plurality of bond pads disposed on a first surface thereof. Inner lead portions of a TAB leadframe are coupled to the bond pads and a plurality of outer lead portions are electrically coupled to the inner lead portions extend therefrom. An encapsulation is disposed on the surface of the die including the bond pads and the inner lead portions of the leadframe and about the sides of the semiconductor die. A bottom surface of the semiconductor device remains exposed.

BRIEF DESCRIPTION OF THE DRAWINGS

The single figure is a highly enlarged cross-sectional view of a semiconductor package in accordance with the present invention.

DETAILED DESCRIPTION OF THE DRAWINGS

The single figure is a highly enlarged cross-sectional view of a semiconductor package 10 in accordance with the present invention. Package 10 includes a semiconductor die 12, comprising silicon herein although the present invention may be employed with dice comprising other well known semiconducting materials. Die 12 has a first surface 14, a second surface 16, and sides 18.

First surface 14 of die 12 includes bond pads 20 disposed thereon. Bond pads 20 preferably comprise an aluminum pad formed directly on the silicon of die 12 and a gold bump coupled to the aluminum pad. However, if the aluminum and gold are in direct contact, the formation of intermetallics is likely. Therefore, in a most preferable situation, a pad passivation layer comprising a polyimide or glass is formed over the aluminum pad. An opening is formed in the pad passivation layer to expose the aluminum pad and a titanium-tungsten barrier layer is formed on the exposed portion of the aluminum. A gold layer is then formed on the barrier layer and the gold bump is formed on the gold layer. The bond pad as just described allows a gold bump to be fabricated on an aluminum pad without intermetallic formation and the passivation layer prevents moisture and contaminants from attacking the aluminum pad.

A TAB lead tape 22 comprises a flexible insulating material 24, polyimide in a preferred embodiment. A conductive pattern 26 is disposed on polyimide 24. Typically, conductive pattern 26 comprises copper and the portions thereof that may ultimately contact bond pads 20 are tin plated. Conductive pattern 26 includes inner lead portions 28 which are directly coupled to bond pads 20 as is well known in the art. Typically, the tin of the plated inner lead portions and the gold bumps of bond pads 20 form a eutectic alloy. Conductive pattern 26 further includes outer lead portions 30 electrically coupled to inner lead portions 28 and extending therefrom.

Once TAB lead tape 22 is coupled to bond pads 20, a protective coating 32 is formed on first surface 14 of substrate 12 including bond pads 20 and also over inner lead portions 28 of TAB lead tape 22. Protective coating 32 may comprise a polyimide, an epoxy, a polyester or silicone. Protective coating 32 serves to protect bond pads 20 and first surface 14 of die 12 from moisture and contaminants.

An encapsulation 34 is disposed about first surface 14 and sides 18 of die 12. Second surface 16 of die 12 remains exposed. Encapsulation 34 may comprise a polymer, a plastic, an epoxy or a polyester and may be formed by molding processes as are well known in the semiconductor and molding arts. For example, encapsulation in plastic may occur by pot injection transfer molding while encapsulation with a polyester may occur by parting line injection transfer molding. As depicted, semiconductor die 12 includes tapers 36 wherein sides 18 of die 12 are tapered inward adjacent to second surface 16. Tapers 36 allow the encapsulation to better mechanically adhere to or "grip" die 12.

Package 10 derives many advantages from having second surface 16 of die 12 exposed rather than encapsulated within encapsulation 34. Package 10 has excellent thermal dissipation characteristics. Heat may dissipate directly from package 10 through second surface 16 of die 12 without having to dissipate through encapsulation 34. Since it is believed that 90 percent of the heat dissipated from die 12 dissipates through second surface 16, this creates a vast improvement. Further, if desired, the exposed silicon of second surface 16 may be directly coupled to a heatsink or a board for thermal cooling although neither is necessary for many applications. Because package 10 has enhanced thermal dissipation characteristics, die 12 may comprise a relatively high powered die having a greater wattage compared to those disposed in a package wherein die 12 would be completely encapsulated.

Because entire die 12 is not encapsulated, package 10 may be made much thinner than its completely encapsulated counterpart. This is due to the fact that there is no encapsulation disposed beneath second surface 16 of die 12 to add thickness to package 10. Further, thinner packages may be fabricated with TAB bonding and the present invention because TAB bonding does not require the height necessary for a wire bond. TAB bonding as set forth above works very well with the present invention. Moisture and contaminants may penetrate package 10 through the interfaces between sides 18 of die 12 and encapsulation 34. Protective coating 32 as well as the pad passivation layer set forth protect first surface 14 and bond pads 20 of die 12 from the moisture and contaminants.

A present trend in the semiconductor arts is to employ larger wafers to fabricate semiconductor devices. The package in accordance with the present invention is highly desirable with devices fabricated on large wafers. When a larger wafer is employed, it must be thicker so that it does not easily break. For example, an eight inch wafer typically has a thickness on the order of 30 mils. Because no encapsulation is 34 is disposed beneath second surface 16, the package may be kept thin even with a thicker wafer. Further, package thickness specifications may be met without backgrinding second surface 16 of die 12 prior to package assembly.

Package 10 is also relatively inexpensive to produce. Package 10 employs less encapsulating material in encapsulation 34 because no encapsulating material is disposed beneath second surface 16. Also, because a heatsink is not necessary, its expense is saved.

Thus it is apparent that there has been provided, in accordance with the invention, an improved semiconductor package having an exposed die surface. While specific embodiments of the invention have been shown and described, further modifications will occur to those of skill in the art. It is desired that it be understood, therefore, that this invention is not limited to the particular forms shown and it is intended in the appended claims to cover all modifications which do not depart from the spirit and scope of this invention.

What is claimed is:

1. A semiconductor package comprising:
    a semiconductor die having a first surface including a plurality of bond pads disposed thereon, a second surface and sides between said first and second surface;
    a TAB leadframe having a plurality of inner lead portions coupled to said bond pads and a plurality of outer lead portions electrically coupled to said inner lead portions;
    a molded encapsulation disposed on said first surface including said bond pads and said inner lead portions of said leadframe and on said sides; and
    wherein said second surface of said die is exposed.

2. The package of claim 1 further including a protective coating disposed on the first surface of the die including the inner lead portions of the leadframe.

3. The package of claim 2 wherein the protective coating comprises a polyimide, an epoxy, a polyester or silicone.

4. The package of claim 1 wherein means comprise the die having its sides tapered inward adjacent to the second surface.

5. The package of claim 1 wherein the encapsulation comprises a polymer, a plastic, an epoxy or a polyester.

6. A semiconductor package comprising:
    a semiconductor die having a first surface, a second surface and sides therebetween;
    a leadframe having a plurality of leads electrically coupled to said die;
    protective means disposed on said first surface of said die including a portion of said leads coupled to said die; and
    a molded encapsulation disposed about said die except for said second surface which remains exposed.

7. The package of claim 6 wherein the die includes bond pads disposed on the first surface thereof to which the leads of the leadframe are electrically coupled.

8. The package of claim 7 wherein the leadframe comprises a TAB leadframe having a plurality of inner lead portions physically and electrically coupled to the bond pads of the die and a plurality of outer lead portions electrically coupled to said inner lead portions.

9. The package of claim 6 wherein protective means comprise a coating of polyimide, epoxy, polyester or silicone.

10. The package of claim 6 wherein means for mechanically enhancing comprise the die having its sides tapered inward adjacent to the second surface.

11. The package of claim 6 wherein the encapsulation comprises a polymer, a plastic, an epoxy or a polyester.

* * * * *